US012785236B2

(12) United States Patent
Kawashita et al.

(10) Patent No.: US 12,785,236 B2
(45) Date of Patent: Nov. 3, 2026

(54) QUANTUM DEVICE WITH HIGHPASS FILTER HAVING NOTCHES IN FIRST BAND LOWER THAN SECOND BAND AND COUPLING EFFICIENCY IN SECOND BAND HIGHER THAN IN FIRST BAND

(71) Applicants: Fujitsu Limited, Kawasaki (JP); RIKEN, Wako (JP)

(72) Inventors: Mitsuya Kawashita, Kawanishi (JP); Shuhei Tamate, Wako (JP)

(73) Assignees: Fujitsu Limited, Kawasaki (JP); RIKEN, Wako (JP)

( * ) Notice: Subject to any disclaimer, the term of this patent is extended or adjusted under 35 U.S.C. 154(b) by 92 days.

(21) Appl. No.: 18/826,884

(22) Filed: Sep. 6, 2024

(65) Prior Publication Data

US 2025/0286259 A1 Sep. 11, 2025

(30) Foreign Application Priority Data

Sep. 14, 2023 (JP) ................................ 2023-149424

(51) Int. Cl.
*H03H 7/01* (2006.01)
*G06N 10/40* (2022.01)
*H01P 1/202* (2006.01)

(52) U.S. Cl.
CPC ............. *H01P 1/202* (2013.01); *G06N 10/40* (2022.01); *H03H 7/0115* (2013.01); *H03H 2007/013* (2013.01)

(58) Field of Classification Search
CPC ........ H01P 1/202; G06N 10/40; G06N 10/20; G06N 10/00; G06N 10/70; H03H 7/0115; H03H 7/1775; H03H 2007/013; H03K 19/20
See application file for complete search history.

(56) References Cited

U.S. PATENT DOCUMENTS 9,438,246 B1 * 9/2016 Naaman .................. G11C 11/44
10,043,136 B1 8/2018 Abdo
(Continued)

FOREIGN PATENT DOCUMENTS

JP 2021-170649 A 10/2021
WO 2020/105732 A1 5/2020
WO WO-2023225171 A1 * 11/2023 ............ H10N 69/00

OTHER PUBLICATIONS

Extended European Search Report dated Feb. 7, 2025, issued in EP Application No. 24199176.9. (10 pages).
(Continued)

*Primary Examiner* — John W Poos
(74) *Attorney, Agent, or Firm* — WHDA, LLP

(57) ABSTRACT

A quantum device includes a filter having a plurality of notches in a first frequency band lower than a second frequency band, a first qubit that resonates in the first frequency band, and a second qubit that resonates in the second frequency band. The first qubit is input with a signal having a frequency at which the first qubit resonates via the filter to control a state of the first qubit when executing a one-qubit gating, and is input with a signal having a frequency at which the second qubit resonates via the filter to control a state of the second qubit according to a quantum state of the first qubit when executing a two-qubit gating.

15 Claims, 7 Drawing Sheets

(56) References Cited

U.S. PATENT DOCUMENTS

| | | | | |
|---|---|---|---|---|
| 11,669,765 | B2 * | 6/2023 | Kelly | H10N 60/80 706/62 |
| 2016/0112031 | A1 * | 4/2016 | Abraham | H03K 19/1954 327/528 |
| 2016/0156356 | A1 * | 6/2016 | Bronn | B82Y 10/00 326/1 |
| 2018/0091244 | A1 * | 3/2018 | Abdo | H03H 7/46 |
| 2022/0021372 | A1 | 1/2022 | Nakamura et al. | |

OTHER PUBLICATIONS

Bronn, N. et al., Reducing Spontaneous Emission in Circuit Quantum Electrodynamics by a Combined Readout/Filter Technique, IEEE Transactions on Applied Superconductivity, IEEE, USA, vol. 25, No. 5, Oct. 1, 2015, p. 1-10, XP011667869, ISSN: 1051-8223, DOI: 10.1109/TASC.2015.2456109 [retrieved on Sep. 2, 2015]. (10 pages); cited in Extended European Search Report dated Feb. 7, 2025.

* cited by examiner

QUANTUM DEVICE WITH HIGHPASS FILTER HAVING NOTCHES IN FIRST BAND LOWER THAN SECOND BAND AND COUPLING EFFICIENCY IN SECOND BAND HIGHER THAN IN FIRST BAND

CROSS-REFERENCE TO RELATED APPLICATIONS

This application is based upon and claims the benefit of priority of the prior Japanese Patent Application No. 2023-149424, filed on Sep. 14, 2023, the entire contents of which are incorporated herein by reference.

FIELD

The embodiments discussed herein are related to quantum devices.

BACKGROUND

In a quantum computer using superconducting quantum bits (hereinafter, also simply referred to as a “qubits”), there is a known method of performing a two-qubit gating operation. In order to control the qubit, the qubit is coupled to a waveguide, and a microwave pulse is irradiated from the waveguide. The stronger the coupling between the qubit and the waveguide is, the shorter the time (or gating time) required to perform the qubit gating operation becomes. On the other hand, the stronger the coupling between the qubit and the waveguide is, the shorter the quantum lifetime (or quantum coherence) of the qubit becomes. That is, increasing the quantum lifetime of the quantum bit and reducing the gating time are in a mutually contradictory relationship, as explained in International Publication Pamphlet No. WO 2020/105732, for example.

In a two-qubit gating (also referred to as a cross resonance gating), a signal having a frequency at which a target qubit resonates is input from the waveguide to a control qubit, such that a state of the target qubit changes according to a state of the control qubit.

In the case of the two-qubit gating, the gating can be speeded up (that is, the gating time can be shortened) by increasing an intensity of the signal input to the control qubit or increasing a coupling efficiency between the waveguide and the qubit. However, if the coupling between the control qubit and the input waveguide is too strong, a radiation loss from the control qubit to the input waveguide increases, and a coherence time (or data retention time) of the control qubit is shortened.

SUMMARY

Accordingly, it is an object in one aspect of the embodiments to provide a quantum device capable of securing a quantum gating speed and a coherence time.

According to one aspect of the embodiments, a quantum device includes a filter having a plurality of notches in a first frequency band lower than a second frequency band; a first qubit that resonates in the first frequency band; and a second qubit that resonates in the second frequency band, wherein the first qubit is input with a signal having a frequency at which the first qubit resonates via the filter to control a state of the first qubit when executing a one-qubit gating, and is input with a signal having a frequency at which the second qubit resonates via the filter to control a state of the second qubit according to a quantum state of the first qubit when executing a two-qubit gating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A quantum device according to one embodiment includes a filter for correcting a level difference between signals required for a one-qubit gating and a two-qubit gating, which are input to each qubit, at each resonance frequency of a control qubit that resonates in a low frequency band and a target qubit that resonates in a high frequency band, in order to implement a quantum logic gate of a quantum computer. The quantum computer includes a one-qubit logic gate such as a Pauli gate or the like, and a two-qubit logic gate such as a controlled Pauli-X gate (or CNOT gate) or the like, and performs a computation using these qubit logic gates. The CNOT gate is used for generating a state of quantum entanglement or the like.

A cross resonance gating is an example of a configuration for inducing the quantum entanglement. The cross resonance gating has a control qubit adjacent to an input end, and a target qubit to be coupled to the control qubit. The control qubit and the target qubit have mutually different resonance frequencies.

Figure 1:
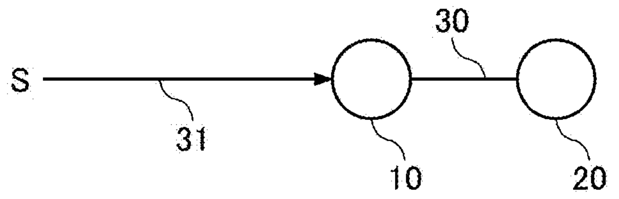
FIG. 1 is a diagram illustrating a connection example of qubits.

FIG. 1 is a diagram illustrating a connection example of qubits. A control signal S for driving a two-qubit gating (or cross resonance gating) in which a control qubit 10 and a target qubit 20 are coupled, is input to the control qubit 10.

In the cross resonance gating, the control signal S having a frequency identical to a resonance frequency (or resonant frequency) of the target qubit 20 is input to the control qubit 10, in order to induce the quantum entanglement between the control quantum bit 10 and the target qubit 20 that are mutually adjacent. Hence, a state of the target qubit 20 changes according to a quantum state of the control qubit 10. The control signal S is, for example, a microwave.

In the case of the cross resonance gating in which the control qubit 10 resonating in a low frequency band and the target qubit 20 resonating in a high frequency band are coupled, the gating can be speeded up (the gating time can be shortened) by increasing an intensity of the control signal S input from a waveguide 31 to the control qubit 10 or increasing a coupling efficiency of the control signal S from the waveguide 31 to the control qubit 10. However, if the coupling intensity between the waveguide 31 and the control qubit 10 is too large, a coherence time (or data retention time) of the control qubit 10 is shortened.

Figure 2:
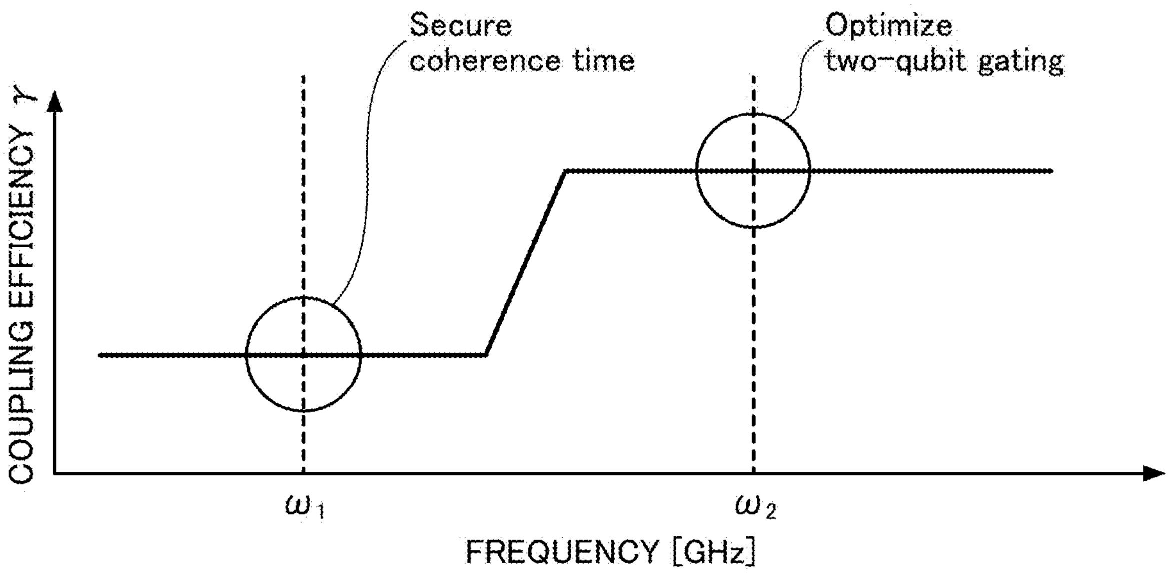
FIG. 2 is a diagram for explaining a frequency dependence of a coupling efficiency between a waveguide and a control qubit.

Hence, the quantum device according to the present embodiment includes a filter structure in which a coupling efficiency γ between the waveguide 31 and the control qubit 10 has a frequency dependence illustrated in FIG. 2. The coupling efficiency γ represents a ratio of an intensity of the control signal S input from the waveguide 31 to the control qubit 10 with respect to an intensity of the control signal S input to the waveguide 31. The intensity of the control signal S is represented by a magnitude of a power of the control signal S, for example. The filter structure according to the present embodiment has a coupling characteristic such that the coupling efficiency γ in a second frequency band including a frequency (resonant frequency $\omega_2$) at which the target qubit 20 resonates is high compared to the coupling efficiency γ in a first frequency band including a frequency (resonant frequency $\omega_1$) at which the control qubit 10 resonates.

Because the coupling efficiency γ is high at the resonant frequency $\omega_2$, the control signal S having a relatively high intensity at the resonant frequency $\omega_2$ is input to the control qubit 10, and thus, it is possible to speed up the two-qubit gating between the control qubit 10 and the target qubit 20. On the other hand, because the coupling efficiency γ is low at the resonant frequency $\omega_1$, it is possible to reduce a radiation loss from the control qubit 10 to the waveguide 31 at the resonant frequency $\omega_1$, and reduce shortening of the coherence time of the control qubit 10. Accordingly, it is possible to provide a two-qubit gating capable of securing the quantum gating speed and the coherence time.

For example, by adopting a filter structure having a high coupling efficiency γ at the resonant frequency $\omega_2$, the quantum gating speed can be secured compared to a case where such a filter structure is not adopted, even if the power of the control signal S input to the waveguide 31 at the resonant frequency $\omega_2$ is reduced. By reducing the power of the control signal S input to the waveguide 31 at the resonant frequency $\omega_2$, it is possible to achieve a reduced power consumption.

For example, the power of the control signal S at the resonant frequency $\omega_2$ can be reduced to the power of the control signal S at the resonant frequency $\omega_1$. It is advantageous for digital generation of the control signal S when the power of the control signal S at the resonant frequency $\omega_2$ and the power of the control signal S at the resonant frequency $\omega_1$ become equal. For example, if signals having a large level difference are created using a single digital-to-analog converter (DAC), a dynamic range of the signals becomes narrow, and a quality of the signals may deteriorate. On the other hand, if such signals having the large level difference are created using a plurality of DACs, a number of required components or parts increases, and cause an increase in the size and cost of the device for generating the control signal S. In contrast, when the power of the control signal S at the resonant frequency $\omega_2$ and the power of the control signal S at the resonant frequency $\omega_1$ become equal, it is possible to reduce the deterioration of the signal quality caused by an insufficient dynamic range, even when the control signal S is generated using a single DAC.

Figure 3:
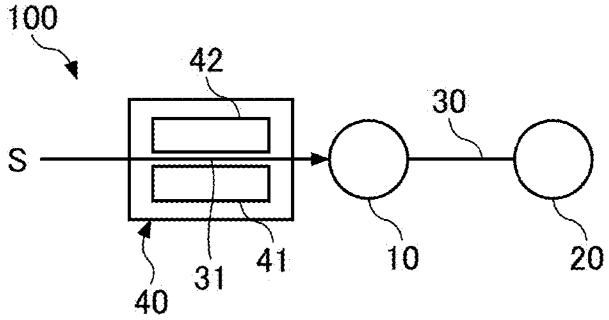
FIG. 3 is a diagram for explaining a quantum device according to one embodiment.

A quantum device 100 according to the present embodiment illustrated in FIG. 3 includes a highpass filter 40 in a stage preceding the control qubit 10. The highpass filter has a coupling characteristic in which the coupling efficiency γ in a second frequency band including the resonant frequency $\omega_2$ is higher than the coupling efficiency γ in a first frequency band including the resonant frequency $\omega_1$.

FIG. 3 is a diagram illustrating a configuration example of the quantum device according to the present embodiment. The quantum device 100 illustrated in FIG. 3 includes the highpass filter 40 that transmits the control signal S in the first frequency band with the coupling efficiency γ lower than that in the second frequency band, the control qubit 10 that resonates in the first frequency band, and the target qubit 20 that resonates in the second frequency band. The quantum device 100 is a cross resonance gating in which the control qubit 10 and the target qubit 20 are coupled via a transmission line 30, for example.

The highpass filter 40 is an example of a filter that transmits a signal in a first frequency band with a coupling efficiency γ lower than that in a second frequency band. The control qubit 10 is an example of a first qubit that resonates in the first frequency band. The target qubit 20 is an example of a second qubit that resonates in the second frequency band.

When implementing a one-qubit gating, a signal having a frequency at which the control qubit 10 resonates is input to the control qubit 10 via the highpass filter 40, thereby controlling a quantum state of the control qubit 10. When implementing a two-qubit gating, the control signal S having a frequency at which the target qubit 20 resonates is input to the control qubit 10 via the highpass filter 40. As a result, a state of the target qubit 20 changes according to the quantum state of the control qubit 10.

The highpass filter 40 included in the quantum device 100 according to the present embodiment has a plurality of notches in a low frequency band (the first frequency band in which the coupling efficiency γ is reduced more than in the second frequency band) including the resonance frequency of the control qubit 10. Hence, it is possible to secure the first frequency band in which the coupling efficiency γ is reduced more than in the second frequency band to have a width that is wide to a certain extent. Because the wide width of the first frequency band can be secured, a coupling efficiency characteristic of the highpass filter 40 in the first frequency band can be made to approximate a flat characteristic. As a result, even when the frequency at which the control qubit 10 resonates is shifted due to manufacturing variations or the like, it is possible to stabilize the operation of the quantum device 100 (cross resonance gating).

Figure 4:
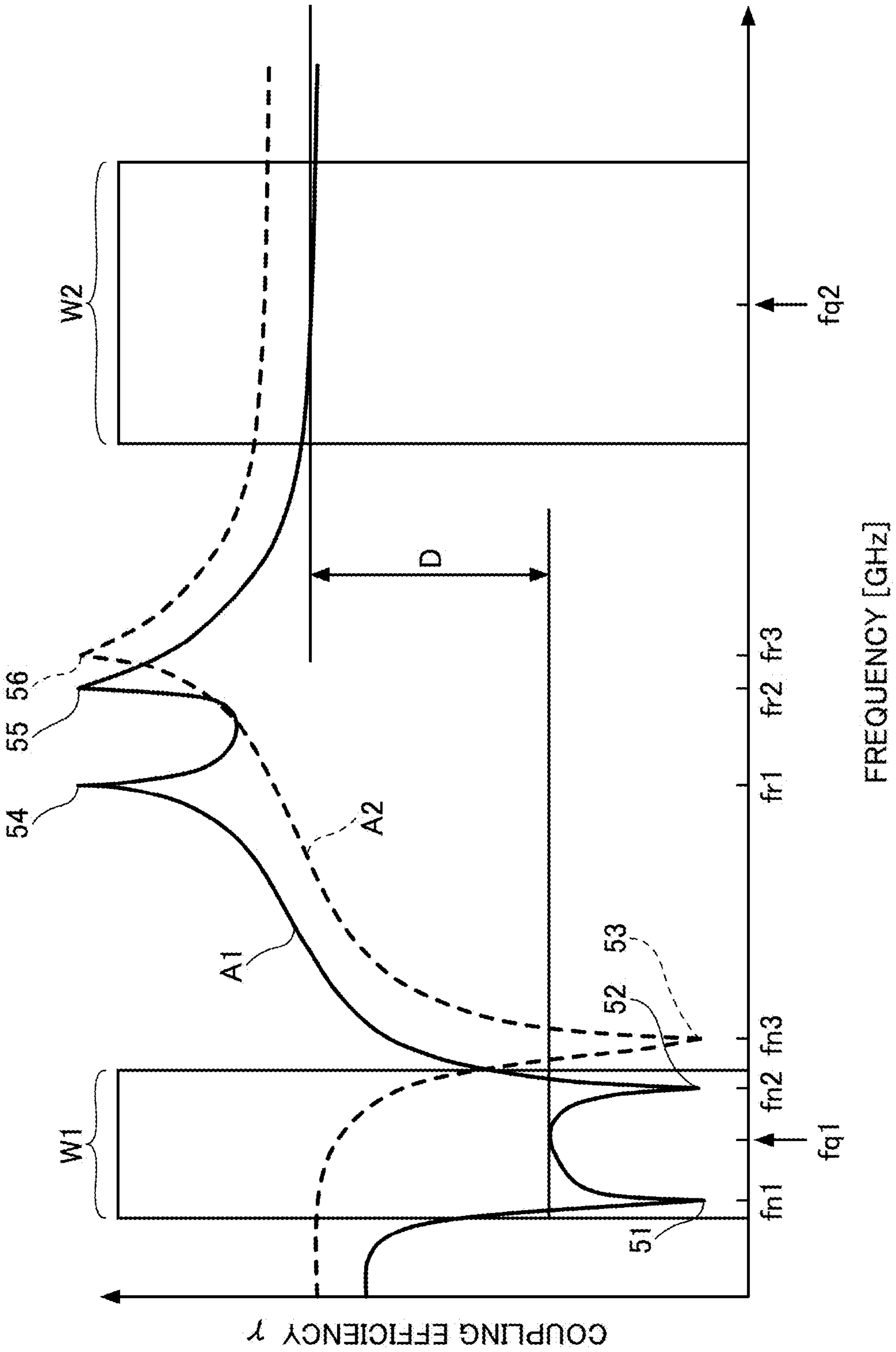
FIG. 4 is a diagram illustrating an example of a frequency characteristic of the coupling efficiency of a filter.

FIG. 4 is a diagram illustrating an example of a frequency characteristic of a coupling efficiency of a filter. The highpass filter 40 has a coupling efficiency characteristic that transmits the control signal S in a first frequency band W1 with a coupling coefficient γ lower than that in a second frequency band W2. The highpass filter 40 has a plurality of notches (in this example, a first notch 51 and a second notch 52) in the first frequency band W1 including a resonant frequency fq1 of the control qubit 10.

The first notch 51 is a frequency characteristic point at which a control signal S1 is minimized at a first notch frequency fn1 included in the first frequency band W1. The second notch 52 is a frequency characteristic point at which the control signal S1 is minimized at a second notch frequency fn2 included in the first frequency band W1. The second notch frequency fn2 is higher than the first notch frequency fn1.

The highpass filter 40 has a frequency characteristic A1 having the first notch 51 and the second notch 52 in the first frequency band W1. Thus, the width of the first frequency band W1 in which the control signal S input to the control qubit 10 is transmitted with the coupling coefficient γ lower than that of the second frequency band W2 can be widened compared to the case of a frequency characteristic A2 having one notch 53 having a notch frequency fn3 in a low frequency band. Because the width of the first frequency band W1 in which the control signal S is transmitted with the coupling coefficient γ lower than that of the second frequency band W2 can be widened, the coupling coefficient characteristic of the highpass filter 40 in the first frequency band W1 can be made to approximate a flat characteristic. As a result, even when the frequency at which the control qubit 10 resonates is shifted due to the manufacturing variations or the like, it is possible to stabilize the operation of the quantum device 100 (cross resonance gating).

In the example illustrated in FIG. 4, the highpass filter 40 has the first notch 51 and the second notch 52 such that a resonance frequency fq1 of the control qubit 10 is interposed between the first notch frequency fn1 and the second notch frequency fn2. In this case, the control qubit 10 resonates in a frequency band interposed between the first notch frequency fn1 and the second notch frequency fn2. Hence, by providing the notches above and below the resonance frequency fq1 of the control qubit 10, it is possible to prevent the coupling efficiency γ at the resonance frequency fq1 from becoming excessively reduced.

FIG. 4 illustrates an example of the frequency characteristic A1 in which the highpass filter 40 has two notches, including the first notch 51 and the second notch 52, in the first frequency band W1. However, the highpass filter 40 may have three or more notches in the first frequency band W1. Thus, it is possible to further widen the width of the first frequency band W1 in which the coupling coefficient γ is reduced more than in the second frequency band W2.

The highpass filter 40 may have a frequency characteristic having one or more resonance points that resonate between the resonance frequency fq1 of the control qubit 10 and the resonance frequency fq2 of the target qubit 20. The example of the frequency characteristic A1 illustrated in FIG. 4 has a first resonance point 54 having a filter resonance frequency fr1 and a second resonance point 55 having a filter resonance frequency fr2, between the resonance frequency fq1 and the resonance frequency fq2. The filter resonance frequency fr1 is higher than the second notch frequency fn2. The filter resonance frequency fr2 is higher than the filter resonance frequency fr1. The frequency characteristic A2 has one resonance point 56 having a filter resonance frequency fr3 between the resonance frequency fq1 and the resonance frequency fq2.

Because the highpass filter 40 has the frequency characteristic A1 that resonates between the resonance frequency fq1 and the resonance frequency fq2, it is possible to increase a coupling efficiency difference D compared to the case where the highpass filter 40 has a frequency characteristic that does not resonate between the resonance frequency fq1 and the resonance frequency fq2. The coupling efficiency difference D represents a difference between the coupling efficiency γ of the highpass filter 40 in the first frequency band W1 and the coupling efficiency γ of the highpass filter 40 in the second frequency band W2. By increasing the coupling efficiency difference D, it is possible to reduce the intensity of the control signal S in the first frequency band W1, even if the intensity of the control signal S in the second frequency band W2 is increased. That is, it is possible to simultaneously increase the quantum gating speed and reduce a decrease in the coherence time.

The highpass filter 40 may have a coupling efficiency characteristic that transmits the control signal S in the first frequency band W1 with a coupling coefficient γ lower than that in the second frequency band W2, by utilizing Fano resonance. By utilizing the Fano resonance, it is possible to easily obtain a frequency characteristic A1 that can secure a large coupling efficiency difference D.

As illustrated in FIG. 3, the highpass filter 40 may include a first filter 41 forming the first notch 51, and a second filter 42 forming the second notch 52. Because each notch is formed by a separate filter, it is possible to improve the accuracy of the first notch frequency fn1 and the second notch frequency fn2. For example, the first filter 41 can implement a frequency characteristic having the first notch 51 and the first resonance point 54 by utilizing the Fano resonance. The second filter 42 can implement a frequency characteristic having the second notch 52 and the second resonance point 55 by utilizing the Fano resonance. The frequency characteristic A1 illustrated in FIG. 4 can be achieved by a combination of the frequency characteristic of the first filter 41 and the frequency characteristic of the second filter 42.

Figure 5:
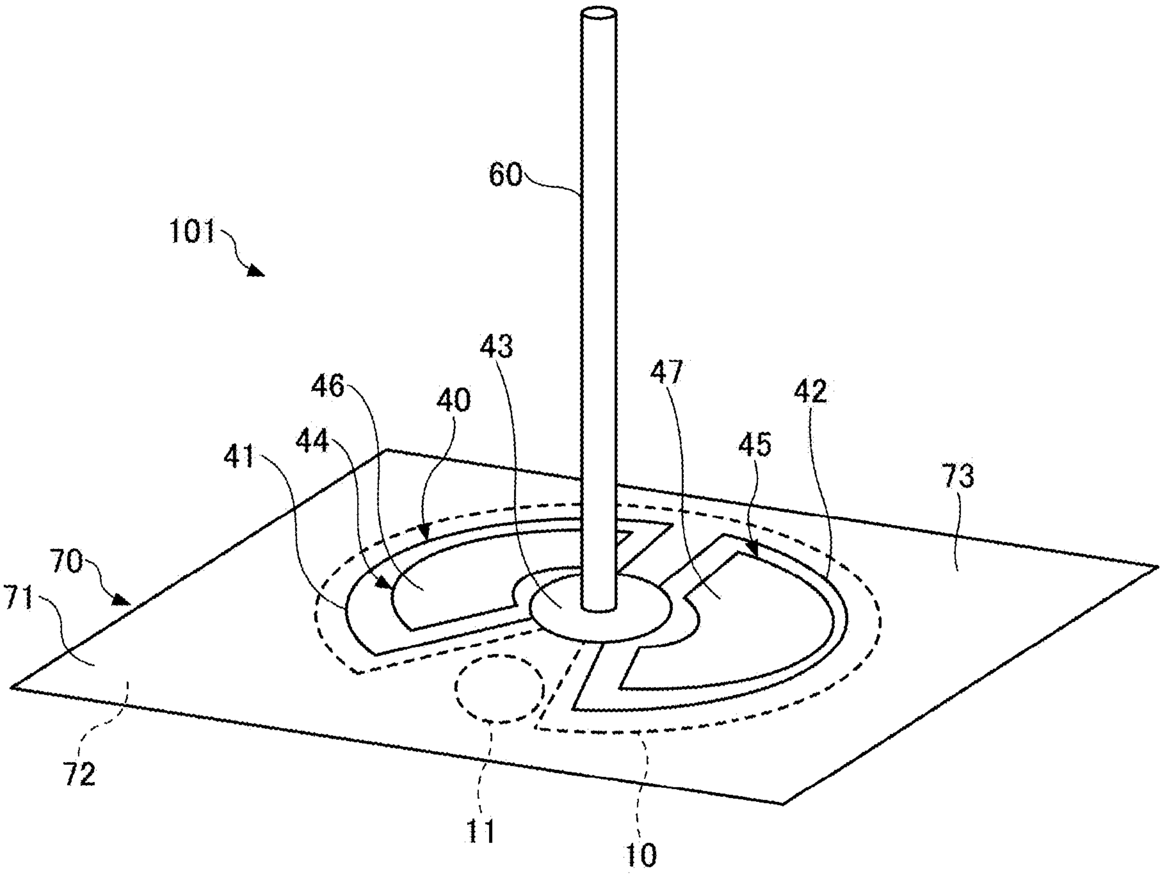
FIG. 5 is a perspective view illustrating a configuration example of the quantum device according to a first embodiment.

FIG. 5 is a diagram illustrating a configuration example of the quantum device according to a first embodiment. A quantum device 101 illustrated in FIG. 5 is an example of the quantum device 100 described above. The quantum device 101 illustrated in FIG. 5 includes a substrate 70 having a first layer 71 facing a first direction, and a second layer 72 facing a second direction opposite to the first direction. One of the first layer 71 and the second layer 72 is a front surface layer of the substrate 70, and the other of the first layer 71 and the second layer 72 is a rear surface layer of the substrate 70. The substrate 70 is a dielectric substrate on which a predetermined conductor pattern is formed.

A terminal 43 to which the control signal S is input is provided on the first layer 71. A terminal 43 is electrically connected to a coaxial line 60 that transmits the control signal S. The terminal 43 is an electrode, such as a planar terminal pad or the like, for example. The coaxial line 60 is an example of a transmission line, such as a coaxial cable or the like, for example. The coaxial line 60 is an example of the waveguide 31 described above. The control signal S input to the terminal 43 via the coaxial line 60 passes through an inner layer of the substrate 70, and reaches the control qubit 10 provided on the second layer 72. Although not illustrated in FIG. 5, the target qubit 20 coupled to the control qubit 10 is provided on the second layer 72, for example.

Because the quantum device 101 has the configuration in which the control signal S is transmitted from the first layer 71 to the second layer 72, a length of a transmission line for transmitting the control signal S from the terminal 43 to the control qubit 10 is relatively short (approximately equal to a thickness of the substrate 70). For this reason, according to conventional techniques, it is difficult to provide a highpass filter having a coupling efficiency characteristic like the frequency characteristic A1 described above on the transmission line from the terminal 43 to the control qubit 10, due to space constraints.

Accordingly, in the quantum device 101 according to the first embodiment, the highpass filter 40 (more specifically, the first filter 41 and the second filter 42), which utilizes an interference of the Fano resonance for the coupling efficiency characteristic, is provided on the first layer 71. Hence, even in the quantum device 101 having a configuration in which it is difficult to sufficiently secure the length of the transmission line for transmitting the control signal S from the terminal 43 to the control qubit 10, it is easy to form the highpass filter 40 having the frequency characteristic A1 described above.

The first filter 41 and the second filter 42 are provided around the terminal 43. Thus, it easy to form the highpass filter 40 having the frequency characteristic A1 described above that transmits the control signal S input to the control qubit 10 from the terminal 43 with the low coupling coefficient γ. In this example, the second filter 42 is formed so as to oppose the first filter 41 with the terminal 43 interposed therebetween.

The first filter 41 includes a first resonator 44 adjacent to the terminal 43, and the second filter 42 includes a second resonator 45 adjacent to the terminal 43. The first resonator 44 is a high-frequency circuit that forms the first resonance point 54 of the frequency characteristic A1, and the second resonator 45 is a high-frequency circuit that forms the second resonance point 55 of the frequency characteristic A1. The second resonator 45 is formed so as to oppose the first resonator 44 with the terminal 43 interposed therebetween. The first resonator 44 is disposed between the terminal 43 and a ground 73. The second resonator 45 is disposed between the terminal 43 and the ground 73. The ground 73 is formed on the first layer 71.

The first resonator 44 includes a first conductor pattern 46 formed on the first layer 71. The second resonator 45 includes a second conductor pattern 47 formed on the first layer 71. The first conductor pattern 46 and the second conductor pattern 47 are linear conductors formed in a fan-shaped area illustrated in FIG. 4 and folded back a plurality of times, for example.

The control qubit 10 includes a Josephson junction 11 that does not overlap the first resonator 44 and the second resonator 45 in a plan view of the substrate 70. Thus, effects of crosstalk of the first resonator 44 and the second resonator 45 on the Josephson junction 11 can be reduced, and thus, the coherence time (an average time for which the qubit maintains an excited state of "1") of the control qubit 10 can be maintained.

Figure 6:
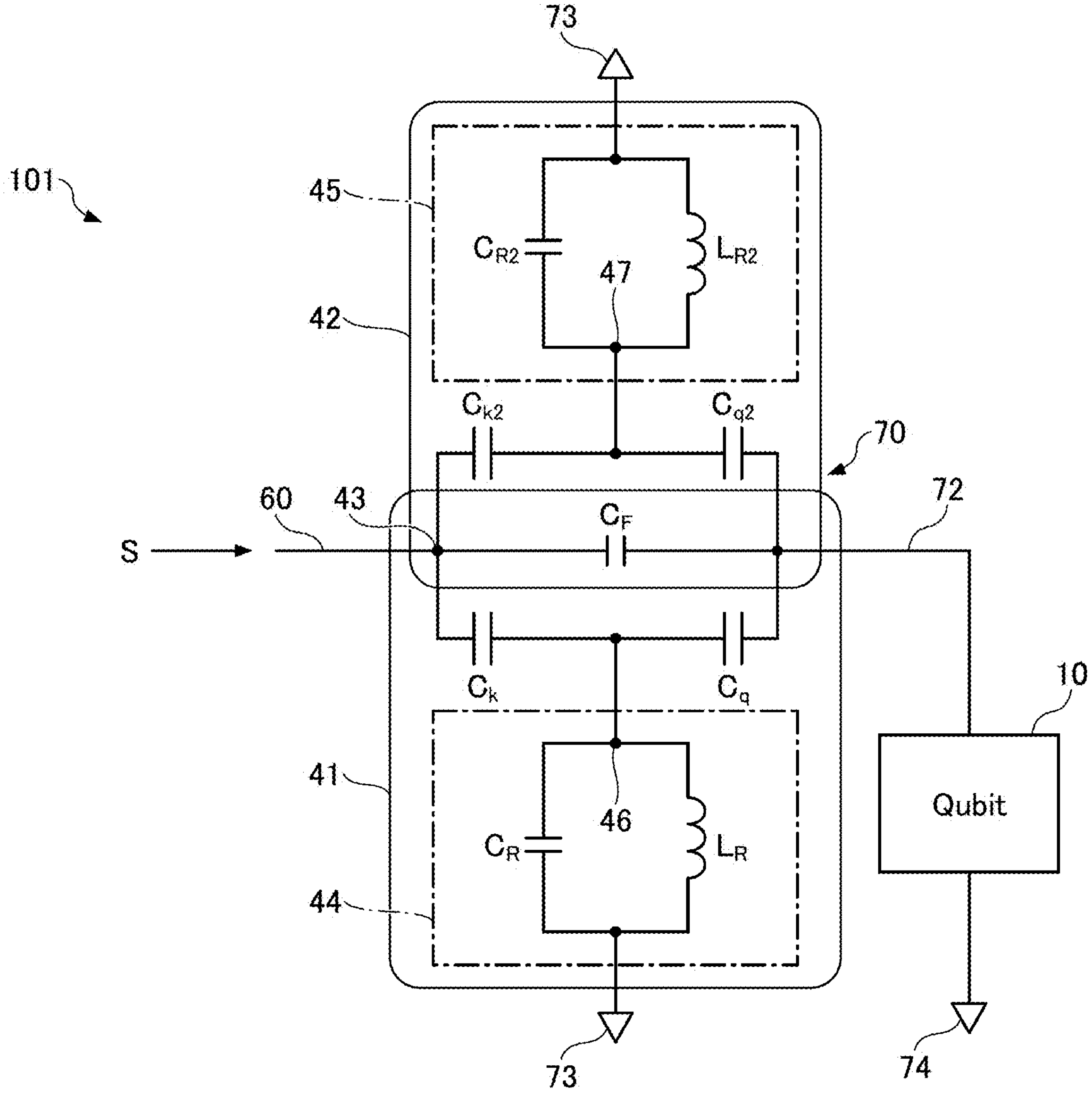
FIG. 6 is an equivalent circuit diagram of the quantum device according to the first embodiment.

FIG. 6 is an equivalent circuit diagram of the quantum device according to the first embodiment illustrated in FIG. 5. The substrate 70 has a substrate capacitance $C_F$ between the terminal 43 and the control qubit 10. The substrate capacitance $C_F$ is a coupling capacitance between the terminal 43 and the control qubit 10, and is included in the first filter 41 and the second filter 42.

The first filter 41 includes a first capacitance $C_k$ between the terminal 43 and the first conductor pattern 46 of the first resonator 44, and a second capacitance $C_q$ between the first conductor pattern 46 of the first resonator 44 and the control qubit 10. That is, the first conductor pattern 46 forms the first capacitance $C_k$ between the first conductor pattern 46 and the terminal 43, and forms the second capacitance $C_q$ between the first conductor pattern 46 and the control qubit 10. The first notch 51 is formed by a destructive interference (Fano resonance) between a signal transmitted to the control qubit 10 via the first resonator 44 by the first capacitance $C_k$ and the second capacitance $C_q$ and a signal transmitted directly to the control qubit 10 from the waveguide via the substrate capacitance $C_F$.

The second filter 42 includes a third capacitance $C_{k2}$ between the terminal 43 and the second conductor pattern 47 of the second resonator 45, and a fourth capacitance $C_{q2}$ between the second conductor pattern 47 of the second resonator 45 and the control qubit 10. That is, the second conductor pattern 47 forms the third capacitance $C_{k2}$ between the second conductor pattern 47 and the terminal 43, and forms the fourth capacitance $C_{q2}$ between second conductor pattern 47 and the control qubit 10. The second notch 52 is formed by a destructive interference between a signal transmitted to the control qubit 10 via the second resonator 45 by the third capacitance $C_{k2}$ and the fourth capacitance $C_{q2}$ and a signal transmitted directly to the control qubit 10 from the waveguide via the substrate capacitance $C_F$.

The first resonator 44 includes a fifth capacitance $C_R$ between the first conductor pattern 46 and the ground 73, and a first inductor $L_R$ between the first conductor pattern 46 and the ground 73. The first resonator 44 is an LC resonator including the fifth capacitance $C_R$ and the first inductor $L_R$. The first resonance point 54 is formed by the first resonator 44.

The second resonator 45 includes a sixth capacitance $C_{R2}$ between the second conductor pattern 47 and the ground 73, and a second inductor $L_{R2}$ between the second conductor pattern 47 and the ground 73. The second resonator 45 is an LC resonator including the sixth capacitance $C_{R2}$ and the second inductor $L_{R2}$. The second resonance point 55 is formed by the second resonator 45.

Figure 7:
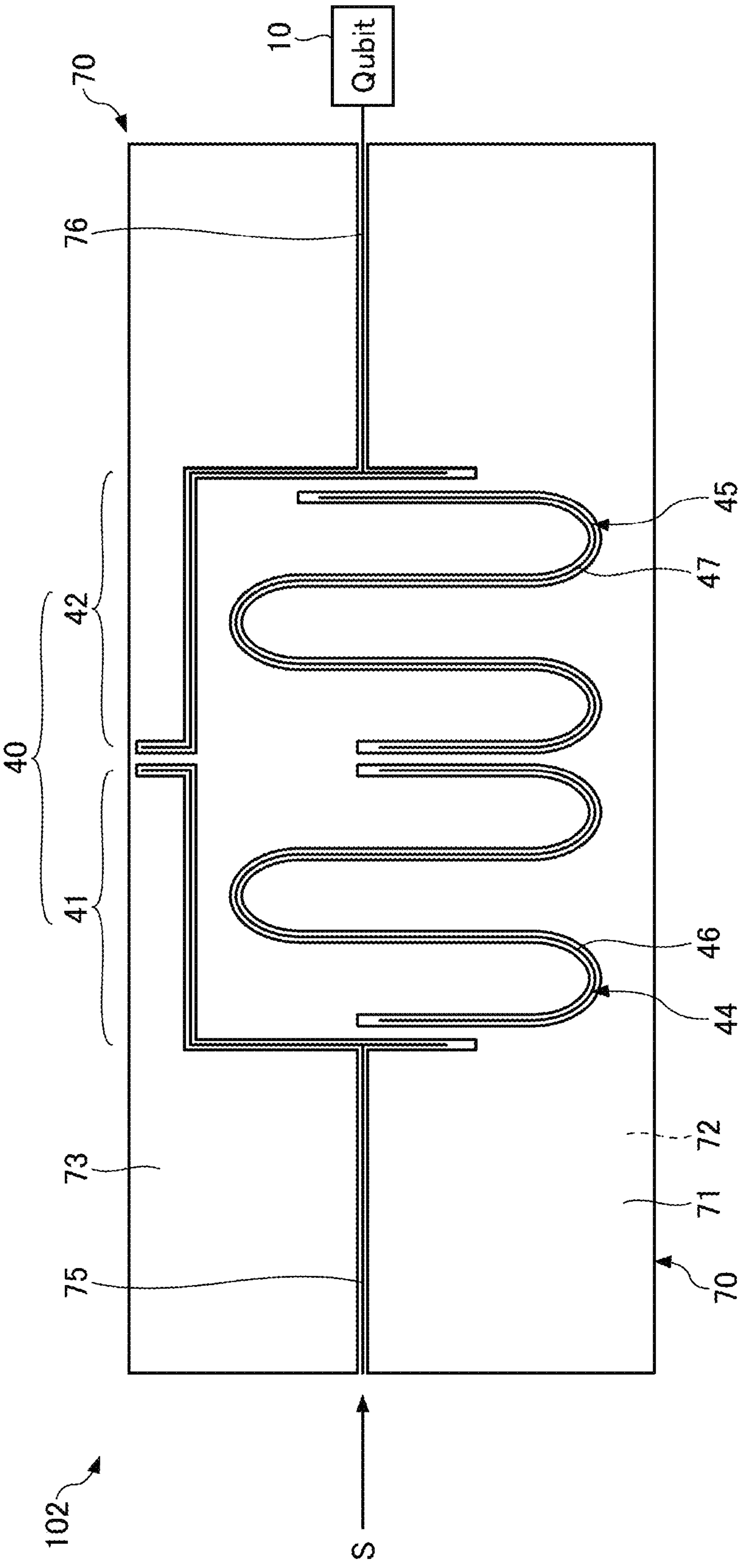
FIG. 7 is a plan view illustrating a configuration example of the quantum device according to a second embodiment.

FIG. 7 is a plan view illustrating a configuration example of the quantum device according to a second embodiment. A quantum device 102 illustrated in FIG. 7 is an example of the quantum device 100 described above. The quantum device 102 illustrated in FIG. 7 includes a substrate 70 having an input line 75 to which the control signal S is input and an output line 76 to which the control qubit 10 is connected. The quantum device 102 includes a highpass filter 40 including a plurality of filters (in the example, a first filter 41 and a second filter 42) connected in series between the input line 75 and the output line 76.

The first filter 41 includes a first resonator 44 adjacent to the input line 75, and the second filter 42 includes a second resonator 45 adjacent to the output line 76. The first resonator 44 is a high-frequency circuit that forms a first resonance point 54 of the frequency characteristic A1, and the second resonator 45 is a high-frequency circuit that forms a second resonance point 55 of the frequency characteristic A1. The second resonator 45 is formed so as to face the first resonator 44 with a capacitive coupling interposed therebetween. The first resonator 44 is disposed between the input line 75 and the second resonator 45 so as to be surrounded by a ground 73. The second resonator 45 is disposed between the first resonator 44 and the output line 76 so as to be surrounded by the ground 73. The ground 73 is formed on a first layer 71.

The first resonator 44 includes a first conductor pattern 46 formed on the first layer 71. The second resonator 45 includes a second conductor pattern 47 formed on the first layer 71. The first conductor pattern 46 and the second conductor pattern 47 are linear conductors folded back a plurality of times.

Figure 8:
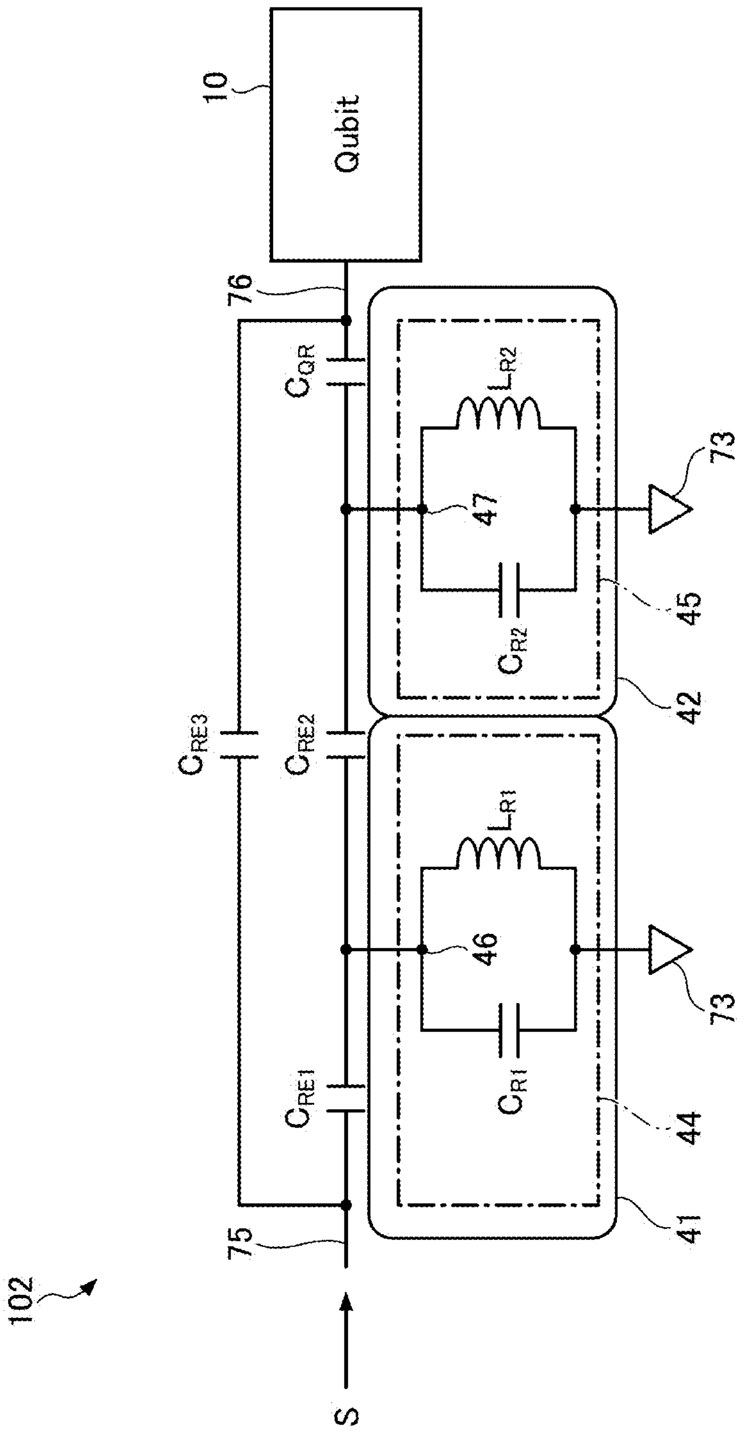
FIG. 8 is an equivalent circuit diagram of the quantum device according to the second embodiment.

FIG. 8 is an equivalent circuit diagram of the quantum device of the second embodiment illustrated in FIG. 7. The quantum device 102 includes a capacitance $C_{RE1}$ between the input line 75 and the first filter 41, and a capacitance $C_{RE2}$ between the first filter 41 and the second filter 42. The quantum device 102 further includes a capacitance $C_{RE3}$ between the input line 75 and the output line 76 or the control qubit 10, and a capacitance $C_{QR}$ between the second filter 42 and the output line 76 or the control qubit 10. The plurality of notches including the first notch 51 and the second notch 52 are formed by a destructive interference between a signal transmitted from the input line 75 to the output line 76 via the first resonator 44 and the second resonator 45 by the capacitance $C_{RE1}$, the capacitance $C_{RE2}$, and the capacitance $C_{QR}$ and a signal transmitted directly to the output line 76 from the input line 75 by the capacitance $C_{RE3}$.

The first resonator 44 includes a capacitance $C_R$ between the first conductor pattern 46 and the ground 73, and a first inductor $L_R$ between the first conductor pattern 46 and the ground 73. The first resonator 44 is an LC resonator including the capacitance $C_R$ and the first inductor $L_R$. The first resonance point 54 is formed by the first resonator 44.

The second resonator 45 includes a capacitance $C_{R2}$ between the second conductor pattern 47 and the ground 73, and a second inductor $L_{R2}$ between the second conductor pattern 47 and the ground 73. The second resonator 45 is an LC resonator including the capacitance $C_{R2}$ and the second inductor $L_{R2}$. The second resonance point 55 is formed by the second resonator 45.

Figure 9:
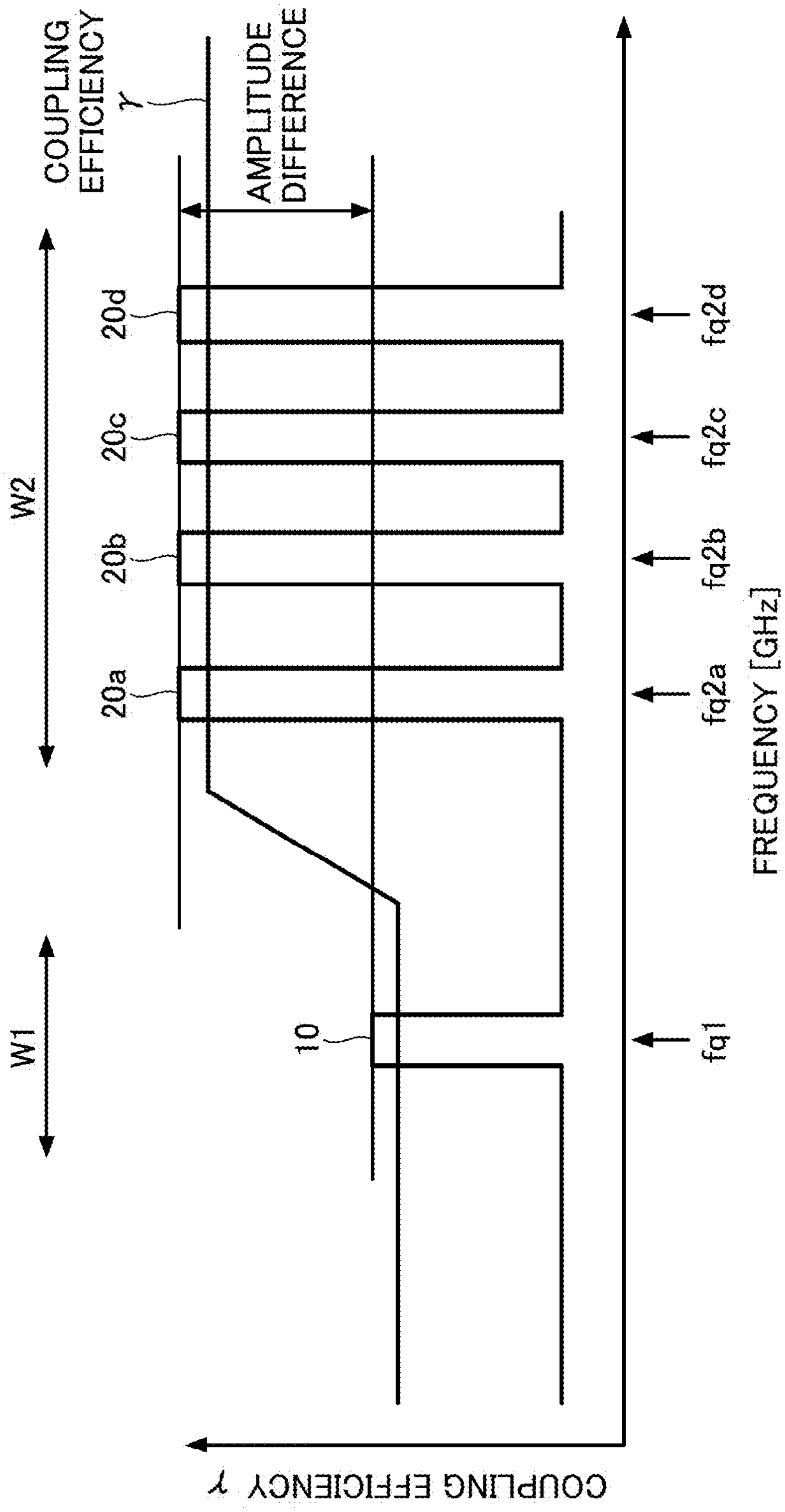
FIG. 9 is a diagram for explaining a frequency characteristic of the coupling efficiency of the filter and resonance frequencies of qubits.

FIG. 9 is a diagram for explaining the frequency characteristic of the coupling efficiency of the filter and the resonance frequency of each qubit. The target qubit 20 may include a plurality of target qubits (in this example, four target qubits 20*a*, 20*b*, 20*c*, and 20*d*) that resonate at mutually different frequencies in the second frequency band W2.

The control qubit 10 has a resonance frequency fq1 within the first frequency band W1. By providing a plurality of notches in the first frequency band W1, the control signal S input to the control qubit 10 is transmitted in the low frequency band including the resonance frequency fq1 with a coupling coefficient γ lower than that in the second frequency band W2.

On the other hand, the plurality of target qubits 20*a*, 20*b*, 20*c*, and 20*d* have resonance frequencies fq2*a*, fq2*b*, fq2*c*, and fq2*d* within the second frequency band W2. The highpass filter 40 has a coupling coefficient γ in the first frequency band W1 lower than a coupling coefficient γ in the second frequency band W2. The plurality of target qubits 20*a*, 20*b*, 20*c*, and 20*d* resonate at frequencies included in a high frequency band having a flat characteristic in the frequency characteristic of the highpass filter 40.

According to the present disclosure, the quantum gating speed and the coherence time can be secured.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

Clause 1

A quantum device comprising:

a filter having a plurality of notches in a first frequency band lower than a second frequency band;

a first qubit that resonates in the first frequency band; and a second qubit that resonates in the second frequency band, wherein the first qubit is input with a signal having a frequency at which the first qubit resonates via the filter to control a state of the first qubit when executing a one-qubit gating, and is input with a signal having a frequency at which the second qubit resonates via the filter to control a state of the second qubit according to a quantum state of the first qubit when executing a two-qubit gating.

Clause 2

The quantum device according to clause 1, wherein the filter resonates between a resonant frequency of the first qubit and a resonant frequency of the second qubit.

Clause 3

The quantum device according to clause 1 or 2, wherein the plurality of notches includes a first notch having a first notch frequency, and a second notch having a second notch frequency higher than the first notch frequency and lower than a resonance frequency of the filter.

Clause 4

The quantum device according to clause 3, wherein the filter includes a first filter forming the first notch, and a second filter forming the second notch.

Clause 5

The quantum device according to clause 4, further comprising:

a substrate including a first layer provided with the first filter and the second filter, and a second layer provided with the first qubit.

Clause 6

The quantum device according to clause 5, wherein:

the first layer is provided with a terminal to which a signal having a frequency at which the first qubit or the second qubit resonates is input, and the first filter and the second filter are provided around the terminal.

Clause 7

The quantum device according to clause 6, wherein the second filter opposes the first filter via the terminal interposed between the first filter and the second filter.

Clause 8

The quantum device according to clause 6 or 7, wherein:

the first filter includes a first resonator in close proximity to the terminal, and the second filter includes a second resonator in close proximity to the terminal.

Clause 9

The quantum device according to clause 8, wherein the first qubit includes a Josephson junction that does not overlap the first resonator and the second resonator in a plan view of the substrate.

Clause 10

The quantum device according to clause 8 or 9, wherein:

the first filter includes a first capacitance between the terminal and the first resonator, and a second capacitance between the first resonator and the first qubit, and the second filter includes a third capacitance between the terminal and the second resonator, and a fourth capacitance between the second resonator and the first qubit.

Clause 11

The quantum device according to any one of clauses 8 to 10, wherein:

each of the first filter and the second filter includes a coupling capacitance between the terminal and the first qubit, and an interference between a signal via the first resonator and a signal via the coupling capacitance forms the first notch, and an interference between a signal via the second resonator and the signal via the coupling capacitance forms the second notch.

Clause 12

The quantum device according to clause 10, wherein:

the first resonator includes a first conductor pattern that forms the first capacitance and the second capacitance, a fifth capacitance between the first conductor pattern and a ground, and a first inductor between the first conductor pattern and the ground, and the second resonator includes a second conductor pattern that forms the third capacitance and the fourth capacitance, a sixth capacitance between the second conductor pattern and the ground, and a second inductor between the second conductor pattern and the ground.

Clause 13

The quantum device according to any one of clauses 1 to 12, wherein the first qubit resonates in a band between the plurality of notches.

Clause 14

The quantum device according to any one of clauses 1 to 13, wherein the second qubit includes a plurality of qubits that resonate at frequencies different from one another in the second frequency band.

Clause 15

The quantum device according to any one of clauses 1 to 14, wherein the filter utilizes Fano resonance.

What is claimed is:

1. A quantum device comprising:

a highpass filter having a plurality of notches in a first frequency band lower than a second frequency band, wherein a coupling efficiency of the highpass filter in the second frequency band is higher than a coupling efficiency of the highpass filter in the first frequency band;

a first qubit that resonates at a first resonant frequency included in the first frequency band; and a second qubit that resonates at a second resonant frequency included in the second frequency band, wherein;

the first qubit is input with a signal having a frequency at which the first qubit resonates via the highpass filter to control a state of the first qubit when executing a one-qubit gating, and is input with a signal having a frequency at which the second qubit resonates via the highpass filter to control a state of the second qubit according to a quantum state of the first qubit when executing a two-qubit gating, and the first qubit is a control qubit, and the second qubit is a target qubit.

2. The quantum device as claimed in claim 1, wherein the highpass filter resonates between the first resonant frequency of the first qubit and the second resonant frequency of the second qubit.

3. The quantum device as claimed in claim 1, wherein the plurality of notches includes a first notch having a first notch frequency, and a second notch having a second notch frequency higher than the first notch frequency and lower than a resonance frequency of the highpass filter.

4. The quantum device as claimed in claim 3, wherein the highpass filter includes a first filter forming the first notch, and a second filter forming the second notch.

5. The quantum device as claimed in claim 4, further comprising:

a substrate including a first layer provided with the first filter and the second filter, and a second layer provided with the first qubit.

6. The quantum device as claimed in claim 5, wherein:

the first layer is provided with a terminal to which a signal having a frequency at which the first qubit or the second qubit resonates is input, and the first filter and the second filter are provided around the terminal.

7. The quantum device as claimed in claim 6, wherein the second filter opposes the first filter via the terminal interposed between the first filter and the second filter.

8. The quantum device as claimed in claim 6, wherein:

the first filter includes a first resonator in close proximity to the terminal, and the second filter includes a second resonator in close proximity to the terminal.

9. The quantum device as claimed in claim 8, wherein the first qubit includes a Josephson junction that does not overlap the first resonator and the second resonator in a plan view of the substrate.

10. The quantum device as claimed in claim 8, wherein:

the first filter includes a first capacitance between the terminal and the first resonator, and a second capacitance between the first resonator and the first qubit, and the second filter includes a third capacitance between the terminal and the second resonator, and a fourth capacitance between the second resonator and the first qubit.

11. The quantum device as claimed in claim 8, wherein:

each of the first filter and the second filter includes a coupling capacitance between the terminal and the first qubit, and an interference between a signal via the first resonator and a signal via the coupling capacitance forms the first notch, and an interference between a signal via the second resonator and the signal via the coupling capacitance forms the second notch.

12. The quantum device as claimed in claim 10, wherein:

the first resonator includes a first conductor pattern that forms the first capacitance and the second capacitance, a fifth capacitance between the first conductor pattern and a ground, and a first inductor between the first conductor pattern and the ground, and the second resonator includes a second conductor pattern that forms the third capacitance and the fourth capacitance, a sixth capacitance between the second conductor pattern and the ground, and a second inductor between the second conductor pattern and the ground.

13. The quantum device as claimed in claim 1, wherein the first qubit resonates in a band between the plurality of notches.

14. The quantum device as claimed in claim 1, wherein the second qubit includes a plurality of qubits that resonate at frequencies different from one another in the second frequency band.

15. The quantum device as claimed in claim 1, wherein the highpass filter utilizes Fano resonance.

* * * * *